United States Patent
Oya et al.

(10) Patent No.: US 10,601,285 B2
(45) Date of Patent: Mar. 24, 2020

(54) WIRING BOARD, ELECTRIC MOTOR, ELECTRIC APPARATUS, AND AIR CONDITIONER

(71) Applicant: Mitsubishi Electric Corporation, Tokyo (JP)

(72) Inventors: Junichiro Oya, Tokyo (JP); Tomoaki Oikawa, Tokyo (JP); Mineo Yamamoto, Tokyo (JP); Hiroyuki Ishii, Tokyo (JP); Hiroki Aso, Tokyo (JP); Yuto Urabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 449 days.

(21) Appl. No.: 15/507,301

(22) PCT Filed: Oct. 23, 2014

(86) PCT No.: PCT/JP2014/078197
§ 371 (c)(1),
(2) Date: Feb. 28, 2017

(87) PCT Pub. No.: WO2016/063396
PCT Pub. Date: Apr. 28, 2016

(65) Prior Publication Data
US 2017/0288509 A1    Oct. 5, 2017

(51) Int. Cl.
*H02K 11/00* (2016.01)
*H05K 3/34* (2006.01)
(Continued)

(52) U.S. Cl.
CPC .......... *H02K 11/0094* (2013.01); *F24F 11/89* (2018.01); *H02K 5/08* (2013.01);
(Continued)

(58) Field of Classification Search
CPC .. F24F 11/89; H02K 1/11; H02K 1/18; H02K 3/3426; H02K 11/00; H02K 11/0094;
(Continued)

(56) References Cited

U.S. PATENT DOCUMENTS 4,594,524 A * 6/1986 Sudo .................. H02K 29/08
                                                 310/184
5,815,919 A   10/1998 Nakanishi et al.
(Continued)

FOREIGN PATENT DOCUMENTS

JP    S50-100061 U    8/1975
JP    51-017509 A     2/1976
(Continued)

OTHER PUBLICATIONS

Office Action dated Oct. 17, 2017 corresponding to JP patent application No. 2016-555019 (and English machine translation attached).
(Continued)

*Primary Examiner* — Jermele M Hollington
*Assistant Examiner* — Rashad H Johnson
(74) *Attorney, Agent, or Firm* — Posz Law Group, PLC (57) ABSTRACT

An object of the present invention is to obtain a wiring board that achieves both of high mounting position accuracy and high solder strength in a circumferential direction. On the wiring board, an electronic component including a plurality of pins is mounted. The wiring board includes a base substrate, a plurality of wires provided on the base substrate, a resist covering the wires, and a plurality of footprints connected to the wires and having entire surfaces exposed in openings of the resist. The pins are soldered to the footprints by reflow. In the openings of the resist, directions in which the pins are led out are parallel to directions in which the wires are led out.

17 Claims, 11 Drawing Sheets

(51) Int. Cl.
*H02K 5/08* (2006.01)
*H02K 11/33* (2016.01)
*H05K 1/18* (2006.01)
*F24F 11/89* (2018.01)
*H05K 1/11* (2006.01)
*H02K 15/12* (2006.01)
*H02K 11/215* (2016.01)

(52) U.S. Cl.
CPC ............ *H02K 11/00* (2013.01); *H02K 11/33* (2016.01); *H05K 1/11* (2013.01); *H05K 1/18* (2013.01); *H05K 3/3426* (2013.01); *H02K 11/215* (2016.01); *H02K 15/12* (2013.01); *H05K 2201/09027* (2013.01); *H05K 2201/10151* (2013.01); *H05K 2201/10772* (2013.01); *Y02P 70/613* (2015.11)

(58) Field of Classification Search
CPC ...... H02K 11/215; H02K 11/33; H02K 15/12; H05K 2201/09027; H05K 2201/10151; H05K 2201/10772; Y02P 70/613
USPC .............................................. 310/43, 68 B, 71
See application file for complete search history.

(56) References Cited

U.S. PATENT DOCUMENTS

| | | | | |
|---|---|---|---|---|
| 2007/0000684 A1* | 1/2007 | Harada | ................ | H05K 1/0269 174/250 |
| 2009/0108716 A1 | 4/2009 | Teshima et al. | | |
| 2011/0001388 A1* | 1/2011 | Fujii | ..................... | H02K 3/522 310/257 |
| 2013/0234547 A1* | 9/2013 | Oguma | ................... | H02K 3/38 310/71 |
| 2013/0234548 A1* | 9/2013 | Oishi | .................... | H02K 5/225 310/71 |

FOREIGN PATENT DOCUMENTS

| | | | |
|---|---|---|---|
| JP | S60-167668 | A | 8/1985 |
| JP | 61-251462 | A | 11/1986 |
| JP | 61-285054 | A | 12/1986 |
| JP | S62-140771 | U | 9/1987 |
| JP | 01-186151 | A | 7/1989 |
| JP | H02-058362 | U | 4/1990 |
| JP | 03-102764 | U | 10/1991 |
| JP | H04-359660 | A | 12/1992 |
| JP | H05-152709 | A | 6/1993 |
| JP | 05-191027 | A | 7/1993 |
| JP | H05-291736 | A | 11/1993 |
| JP | 06-165462 | A | 6/1994 |
| JP | H08-064939 | A | 3/1996 |
| JP | 10-098863 | A | 4/1998 |
| JP | 2004-173401 | A | 6/2004 |
| JP | 2005-183797 | A | 7/2005 |
| JP | 2006-313792 | A | 11/2006 |
| JP | 2008-236957 | A | 10/2008 |
| JP | 4227008 | B2 | 12/2008 |
| JP | 2009-112135 | A | 5/2009 |

OTHER PUBLICATIONS

Office action dated Sep. 28, 2018 issued in corresponding CN patent application No. 201480082834.X (and English machine translation thereof).

Office Action dated Jun. 5, 2018 issued in the corresponding Japanese Patent Application No. 2016-555019 (and English machine translation).

International Search Report of the International Searching Authority dated Dec. 9, 2014 for the corresponding International application No. PCT/JP2014/078197 (and English translation).

* cited by examiner

FIG.18

WIRING BOARD, ELECTRIC MOTOR, ELECTRIC APPARATUS, AND AIR CONDITIONER

CROSS REFERENCE TO RELATED APPLICATION

This application is a U.S. national stage application of PCT/JP2014/078197 filed on Oct. 23, 2014, the contents of which are incorporated herein by reference.

FIELD

The present invention relates to a wiring board, an electric motor, an electric apparatus, and an air conditioner.

BACKGROUND

When pins of an IC (Integrated Circuit) are soldered to wires formed on a wiring board called a printed board, it has been important to prevent the occurrence of the positional misalignment.

An example of a technique for preventing the occurrence of the positional misalignment is known from patent literature 1. Patent Literature 1 discloses a printed wiring board and a printed wiring circuit board to achieve "an object of improving the yield and reliability in reflow-soldering to the printed wiring board the surface-mounted component differing in number of the electrodes between the right and left sides of the component. For the disclosed board, a pad 12(1) on the side having the small number of electrodes is lengthened in the same direction as this small-number-of-electrode side of the component. This allows the lead electrode 22(1) on the small-number-of-electrode side to be soldered at the sufficient soldering surface to the corresponding lengthened pad 12(1a) of the printed wiring board 10.

CITATION LIST

Patent Literature

Patent Literature 1: Japanese Patent Application Laid-Open No. 2005-183797

SUMMARY

Technical Problem

Unfortunately, Patent Literature 1 discloses the technique for suppressing the positional misalignment to such an extent as to prevent a solder failure. This technique is not applicable to the connection of an IC requested to have a high position accuracy of 0.2 mm or less, such as a Hall IC or a Hall element for detecting a magnetic-pole rotational position of a rotor of an electric motor.

A solder resist, which is an insulating film for protecting a circuit pattern, is formed on the surface of such a wiring board. A resist opening is provided in the location of a footprint connected to the Hall IC or the Hall element. The resist opening is formed to be larger than the footprint. For this reason, the footprint in the opening of the resist takes an asymmetrical shape depending on a direction in which the wire on the wiring board is led out. As a result, the mounting position of the Hall IC is misaligned due to a force being applied, during the reflow, in the direction in which the wire is led out.

The present invention has been devised in view of the above and an object of the present invention is to obtain a wiring board that achieves both the high mounting position accuracy and the high solder strength.

Solution to Problem

To solve the above problem and achieve the object, the present invention provides a wiring board on which an electronic component including a plurality of pins is mounted, the wiring board comprising: a base substrate; a plurality of wires provided on the base substrate; a resist covering the wires; and a plurality of footprints connected to the wires and having entire surfaces exposed in openings of the resist, the pins being soldered to the footprints by reflow, wherein in the openings of the resist, directions in which the pins are led out are parallel to directions in which the wires are led out.

Advantageous Effects of Invention

The present invention provides an effect of obtaining a wiring board that achieves both of the high mounting position accuracy and solder strength.

DESCRIPTION OF EMBODIMENTS

Embodiments of a wiring board, an electric motor, an electric apparatus, and an air conditioner according to the present invention are explained in detail below with reference to the drawings. Note that the present invention is not limited by the embodiments.

First Embodiment

Figure 1:
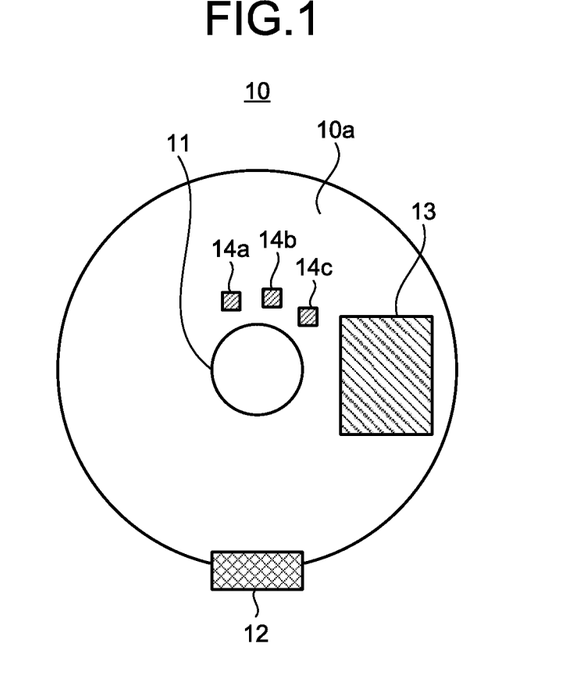
FIG. 1 is a diagram illustrating the configuration of a wiring board according to a first embodiment.
Figure 2:
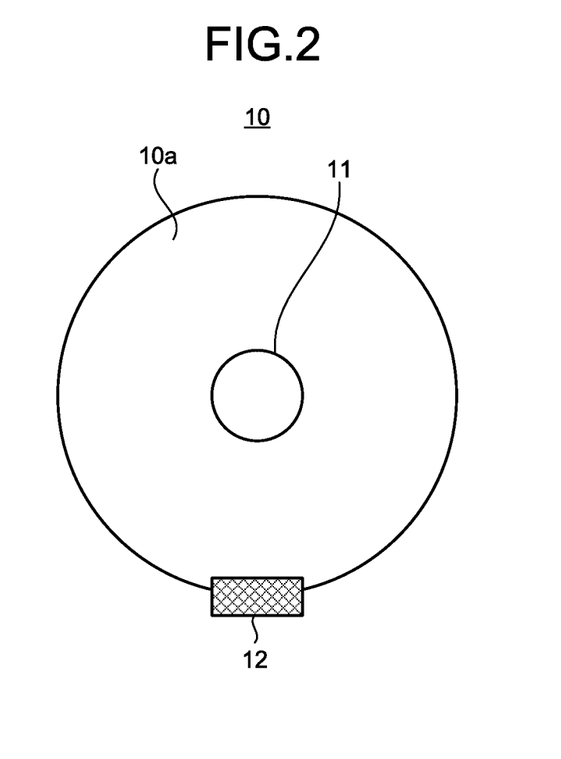
FIG. 2 is a diagram illustrating the configuration of the wiring board according to the first embodiment.

FIGS. 1 and 2 are diagrams illustrating the configuration of a first embodiment of a wiring board according to the present invention. FIG. 1 illustrates a component-mounted-side surface, that is, a front surface of a wiring board 10. FIG. 2 illustrates a no-component-mounted-side surface, that is, a back surface of the wiring board 10.

As illustrated in FIG. 1, the circular wiring board 10 has a hole 11 in the center and includes a connector 12, a surface-mounted inverter IC 13, and surface-mounted Hall ICs 14a to 14c. Note that, although not illustrated in the figure, wires are formed on a base substrate 10a having the components mounted thereon, and a chip resistor or a chip capacitor can be provided on the base substrate 10a. The connector 12 and the inverter IC 13 do not have to be provided on the base substrate 10a. A rotational shaft extend through the hole 11 of the wiring board 10. The front surface of the wiring board 10 on which the components are mounted is disposed on a stator side. The back surface of the wiring board 10 on which the components are not mounted is disposed on a counter-stator side. Note that the wires and the components are mounted on the base substrate 10a, whereby the wiring board 10 is formed.

Figure 3:
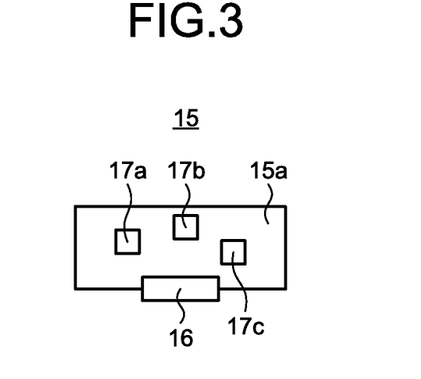
FIG. 3 is a diagram illustrating the configuration of the wiring board according to the first embodiment.
Figure 4:
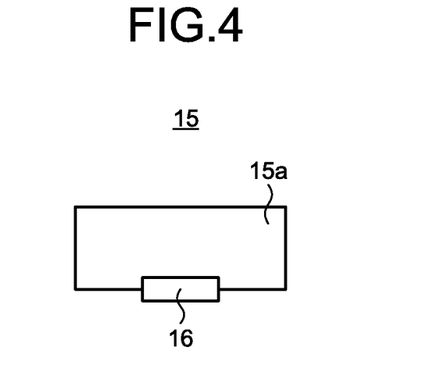
FIG. 4 is a diagram illustrating the configuration of the wiring board according to the first embodiment.

FIGS. 3 and 4 are diagrams illustrating the configuration of the first embodiment of the wiring board according to the present invention but illustrate different forms from those of FIGS. 1 and 2. FIG. 3 illustrates a component-mounted-side surface, that is, a front surface of a wiring board 15. FIG. 4 illustrates a no-component-mounted-side surface, that is, a back surface of the wiring board 15. Only a magnetic position sensor circuit is formed on the wiring board 15 illustrated in FIGS. 3 and 4.

As illustrated in FIG. 3, the wiring board 15 includes a connector 16 and Hall ICs 17a to 17c. Note that, although not illustrated in the figure, wires are formed, and a chip resistor or a chip capacitor can be provided on the base substrate 15a having the components mounted thereon. The connector 16 need not be provided on the base substrate 15a. The front surface of the wiring board 15 on which the components of the wiring board 15 are mounted is disposed on the stator side. The back surface of the wiring board 15 on which the components are not mounted is disposed on the counter-stator side. Note that the wires and the components are mounted on the base substrate 15a, whereby the wiring board 15 is formed.

Figure 5:
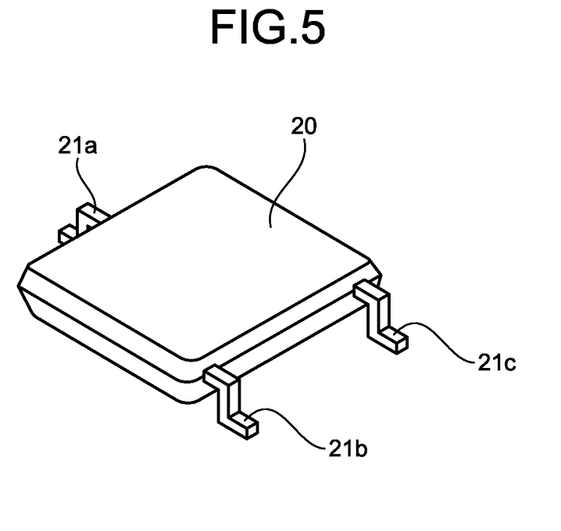
FIG. 5 is a diagram illustrating an IC chip mounted by soldering on the wiring board according to the first embodiment.

FIG. 5 is a view illustrating an IC chip mounted by soldering on the wiring board 10 illustrated in FIGS. 1 and 2 or the wiring board 15 illustrated in FIGS. 3 and 4. The IC chip illustrated in FIG. 5 includes an IC body 20 and IC pins 21a to 21c. The IC body 20 is equivalent to the Hall ICs 14a to 14c illustrated in FIG. 1 or the Hall ICs 17a to 17c illustrated in FIG. 3. The IC pins 21a to 21c are connected to the wiring board 10 or the wiring board 15 by soldering. The soldering is performed by reflow. That is, the components are mounted by the reflow. Since the mounted components are not fixed by an adhesive in the reflow mounting, unlike flow mounting, the mounting-position misalignment occurs due to the surface tension of molten solder during heating in a reflow furnace. The forces causing the mounting-position misalignment are applied to the IC pins 21a to 21c in directions parallel to wires connected to footprints exposed in resist openings. That is, the directions of such forces are parallel to directions in which the wires are led out.

Note that, in this embodiment, for convenience of explanation, as an example, the IC chip includes three pins. However, the present invention is not limited to this. The number of IC pins can be changed as appropriate.

For a Hall IC or a Hall element for detecting a magnetic-pole rotational position of a rotor of an electric motor, position accuracy in the radial direction of the rotor is not required while the position accuracy only in the circumferential direction of the rotor is required. When pins of the Hall IC or the Hall element are led out in directions parallel to the radial direction of the rotor, reducing a circumferential clearance between the pin of the Hall IC or the Hall element and the footprint connected to the pin to 0.2 mm or less improves the mounting position accuracy in the circumferential direction.

Note that, in this specification, the radial direction refers to a direction of radiation from an axis of rotation. The circumferential direction refers to a direction of extension of an arc having the center on the axis of rotation. The radial direction and the circumferential direction are orthogonal to each other. The circumferential clearance is an interval between an end of the pin connected to the footprint in the circumferential direction and an end of the footprint closer to the end of the pin. The radial clearance is an interval between an end of the pin connected to the footprint in the radial direction and an end of the footprint closer to the end of the pin.

Figure 6:
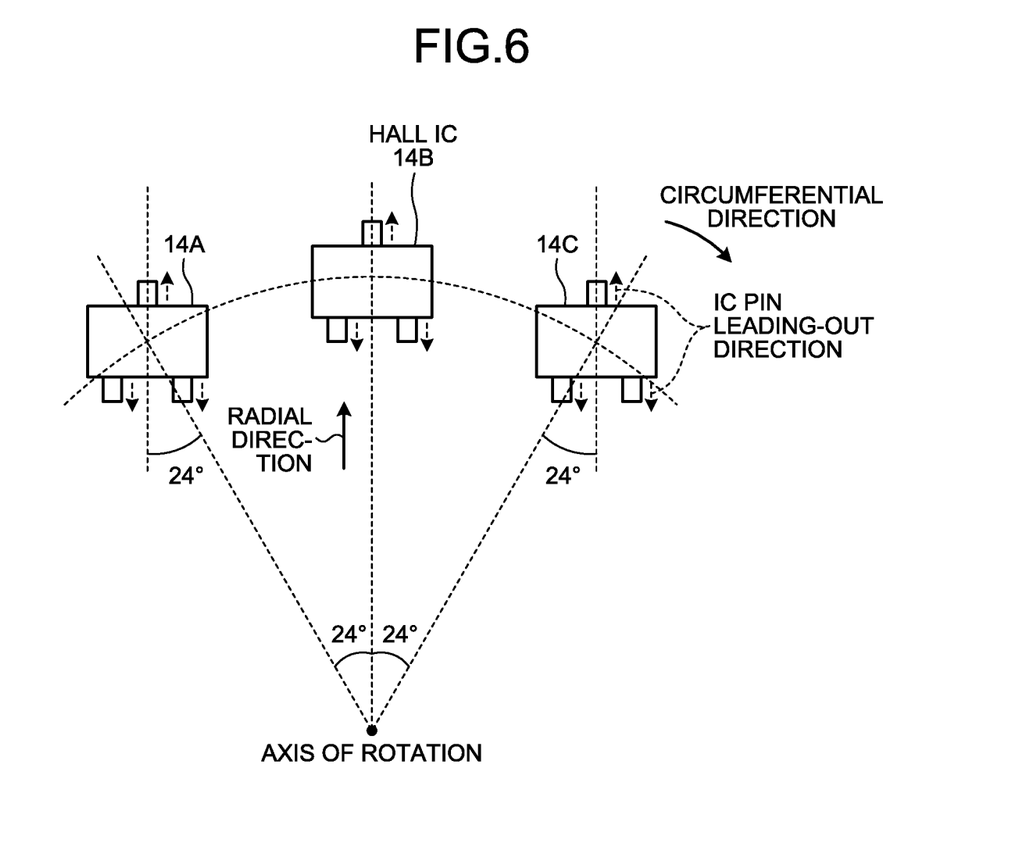
FIG. 6 is a diagram illustrating a positional relation between Hall ICs and a rotor rotation axis.

FIG. 6 is a diagram illustrating a positional relation between Hall ICs and a rotor rotation axis that is the origin of the wiring board. Hall ICs 14A to 14C are equivalent to the Hall ICs 14a to 14c illustrated in FIG. 1. Note that, in FIG. 6, the Hall ICs are disposed at intervals of 24 degrees. In the Hall ICs 14A to 14C illustrated in FIG. 6, an angle formed between the radial direction and the direction in which an IC pin is led out is 24 degrees. However, the angle is not limited to this and should be 45 degrees or less. Note that, in a circular substrate, the origin of a wiring board is located in the center of the wiring board.

As explained above, the Hall ICs 14A to 14C detect the rotor magnetic pole position of the electric motor. Therefore, the position accuracy in the radial direction is not required while the position accuracy in the circumferential direction is required. When the angle between the radial direction of the rotor and the directions in which the pins of the Hall IC or the Hall element are led out is 45 degrees or less, preferably, 0 degree at which the radial direction of the rotor is parallel to the directions in which the pins are led out, reducing the circumferential clearance between the pin of the Hall IC or the Hall element and the footprint connected to the pin to be larger than 0 and equal to or smaller than 0.2 mm improves the mounting position accuracy in the circumferential direction. If the circumferential clearance is merely reduced, unfortunately, a region for formation of a solder fillet is reduced to thereby decrease the solder strength. To maintain the solder strength, therefore, it is conceivable to increase the radial clearance to enlarge the solder-fillet formation region.

In FIG. 6, the Hall ICs are mounted in component mounting equipment in which a changing interval in a mounting direction of the Hall ICs is 90 degrees. For the configuration illustrated in FIG. 6, it is difficult for the pins of the Hall ICs to be led out in the directions parallel to the radial direction. When the Hall ICs 14A to 14C are mounted in the component mounting equipment in which the changing interval of the mounting direction of the Hall ICs 14A to 14C is the 90 degree interval, as illustrated in FIG. 6, thus, the Hall ICs 14A to 14C should be disposed at the angle of 45 degrees or less between the radial direction and the directions in which the IC pins of the Hall ICs 14A to 14C are led out. In FIG. 6, the angle between the radial direction and the directions in which the IC pins are led out is, for example, 24 degrees.

A solder resist, which is an insulating film for protecting a circuit pattern, is formed on the surfaces of the wiring boards 10 and 15. The resist opening is provided in the position of the footprint connected to the Hall IC or the Hall element. The resist opening is formed to be larger than the footprint. For this reason, the footprint in the resist opening takes an asymmetrical shape depending on directions in which wires on the wiring board are led out. The mounting-position misalignment of the Hall IC occurs due to the force being applied, during the reflow, in the directions in which the wires are led out. Note that, the solder resist is typically formed by a negative resist.

Figure 7:
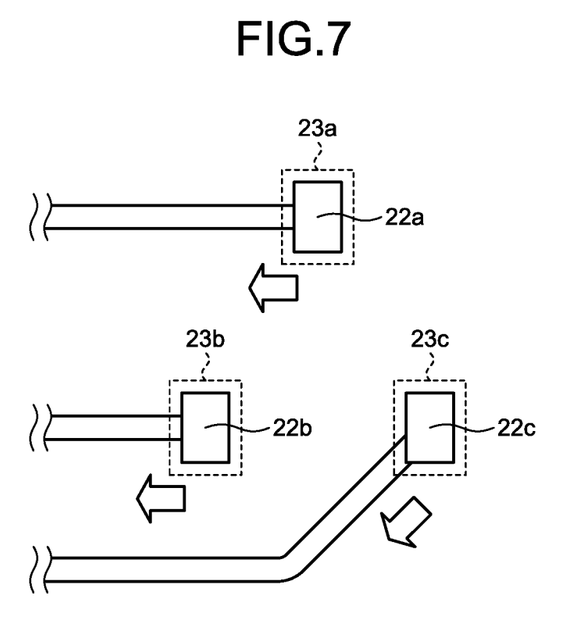
FIG. 7 is a diagram illustrating a positional relation between wires and footprints according to a comparative example in the first embodiment.

FIG. 7 is a diagram illustrating a positional relation between wires and footprints according to a comparative example in the first embodiment. In FIG. 7, a footprint 22a is exposed in a resist opening 23a, a footprint 22b is exposed in a resist opening 23b, and a footprint 22c is exposed in a resist opening 23c. The directions of forces applied to the IC pins 21a to 21c are parallel to directions in which the wires in the resist openings are led out. For the wire connected to the footprint 22a and the wire connected to the footprint 22b illustrated in FIG. 7, the directions of forces applied to the IC pins 21a to 21c during the reflow are parallel to directions in which the IC pins are led out. For the wire connected to the footprint 22c, the directions of the forces applied to the IC pins 21a to 21c during the reflow are not parallel to the directions in which the IC pins are led out. For a wiring board shown in FIG. 7, the mounting-position misalignment of the Hall ICs occurs due to the forces being applied, during the reflow, in the directions in which the wires are led out. The technique for suppressing such a mounting position misalignment is disclosed in the first embodiment.

Figure 8:
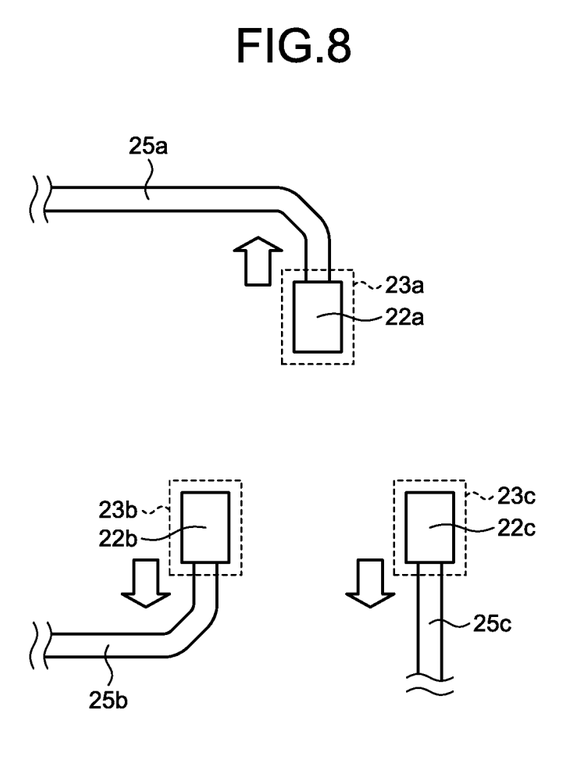
FIG. 8 is a diagram illustrating a positional relation between wires and the footprints on the wiring board according to the first embodiment.

FIG. 8 is a diagram illustrating a first example of a positional relation between the wires and the footprints on the wiring board according to the first embodiment. In FIG. 8 as well, the footprint 22a is exposed in the resist opening 23a, the footprint 22b is exposed in the resist opening 23b, and the footprint 22c is exposed in the resist opening 23c. The directions of forces applied to the IC pins 21a to 21c are parallel to directions in which the wires in the resist openings are led out. For a wire 25a connected to the footprint 22a, a wire 25b connected to the footprint 22b, and a wire 25c connected to the footprint 22c illustrated in FIG. 8, the directions of forces applied to the IC pins 21a to 21c during the reflow indicated by white arrows in FIG. 8 are parallel to directions in which the IC pins are led out. The mounting-position misalignment of the Hall ICs due to the forces being applied, during the reflow, in the directions in which the wires are led out is thus suppressed.

Figure 9:
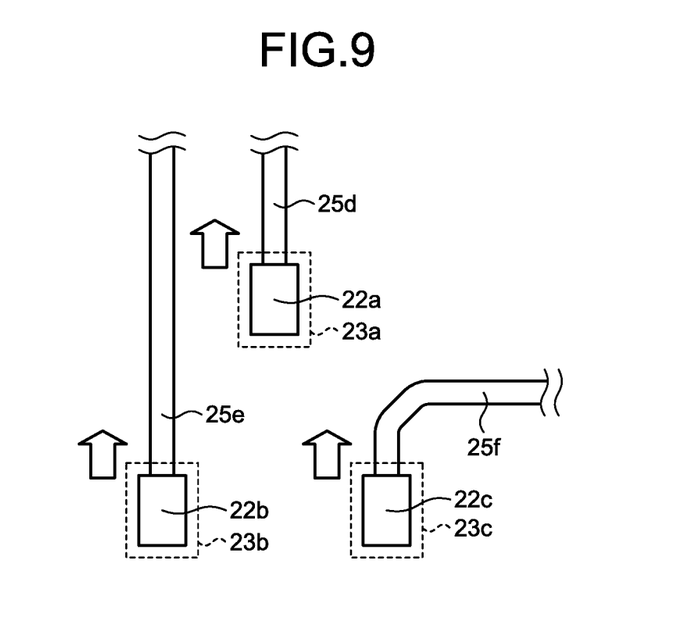
FIG. 9 is a diagram illustrating a positional relation between wires and the footprints on the wiring board according to the first embodiment.

FIG. 9 is a diagram illustrating a second example of the positional relation between the wires and the footprints on the wiring board according to the first embodiment. In FIG. 9 as well, the footprint 22a is exposed in the resist opening 23a, the footprint 22b is exposed in the resist opening 23b, and the footprint 22c is exposed in the resist opening 23c. The directions of forces applied to the IC pins 21a to 21c are parallel to directions in which the wires in the resist openings are led out. For a wire 25d connected to the footprint 22a, a wire 25e connected to the footprint 22b, and a wire 25f connected to the footprint 22c illustrated in FIG. 9, the directions of forces applied to the IC pins 21a to 21c during the reflow indicated by white arrows in FIG. 9 are parallel to the directions in which the IC pins are led out. Since all the wires are led out in the same direction, it is likely that the IC pins are pulled in this direction. However, the misalignment in the circumferential direction is minimized when the angle between the radial direction and the directions in which the IC pins 21a to 21c are led out is 45 degrees or less, preferably, when the radial direction and the directions in which the IC pins are led out are parallel to each other. The configuration illustrated in FIG. 9 as well, thus, suppresses the mounting-position misalignment in the circumferential direction of the Hall ICs due to the forces being applied, during the reflow, in the directions in which the wires are led out.

Figure 10:
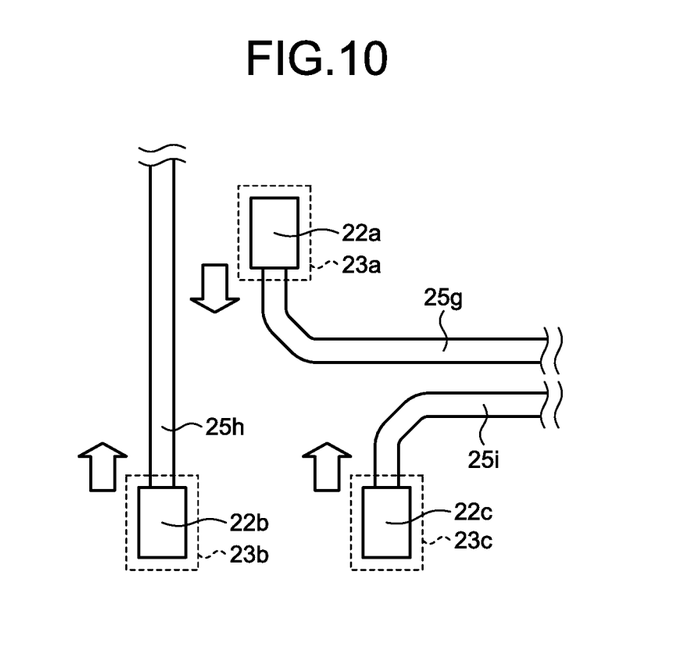
FIG. 10 is a diagram illustrating a positional relation between wires and the footprints on the wiring board according to the first embodiment.

FIG. 10 is a diagram illustrating a third example of a positional relation between the wires and the footprints on the wiring board according to the first embodiment. In FIG. 10 as well, the footprint 22a is exposed in the resist opening 23a, the footprint 22b is exposed in the resist opening 23b, and the footprint 22c is exposed in the resist opening 23c. The directions of forces applied to the IC pins 21a to 21c are parallel to directions in which the wires in the resist openings are led out. For a wire 25g connected to the footprint 22a, a wire 25h connected to the footprint 22b, and a wire 25i connected to the footprint 22c illustrated in FIG. 10, the directions of forces applied to the IC pins 21a to 21c during the reflow indicated by white arrows in FIG. 10 are parallel to directions in which the IC pins are led out. The mounting-position misalignment of the Hall ICs due to forces being applied, during the reflow, in the directions in which the wires are led out is thus suppressed. In FIG. 10, since all of the directions in which the wires are led are the same direction toward an IC body side as the directions on which the pins are led out, the wires in locations exposed in the resist opening can also be used as fillet formation regions. Therefore, it is possible to enlarge the fillet formation regions and thus increase the solder strength.

Figure 11:
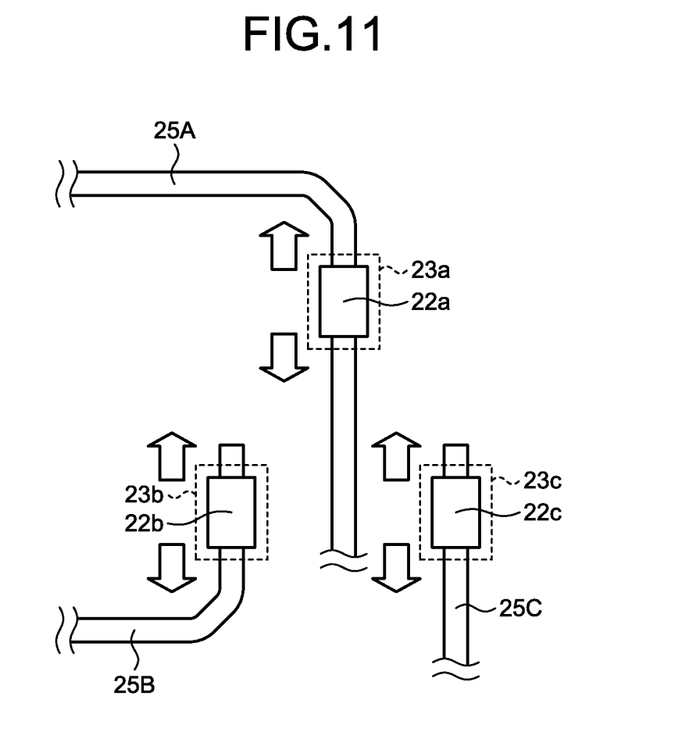
FIG. 11 is a diagram illustrating a positional relation between wires and the footprints on the wiring board according to the first embodiment.

FIG. 11 is a diagram illustrating a fourth example of the positional relation between the wires and the footprints on the wiring board according to the first embodiment. In FIG. 11 as well, the footprint 22a is exposed in the resist opening 23a, the footprint 22b is exposed in the resist opening 23b, and the footprint 22c is exposed in the resist opening 23c. The directions of forces applied to the IC pins 21a to 21c are parallel to directions in which the wires in the resist openings are led out. For a wire 25A connected to the footprint 22a, a wire 25B connected to the footprint 22b, and a wire 25C connected to the footprint 22c shown in FIG. 11, as in FIGS. 8, 9, and 10, the directions of forces applied to the IC pins 21a to 21c during the reflow indicated by white arrows in FIG. 11 are parallel to directions in which the IC pins are led out. The mounting-position misalignment of the Hall ICs due to forces being applied, during the reflow, in the directions in which the wires are led out is thus suppressed. In FIG. 11, further, the wires are led out to the opposite side of the footprints without being terminated in the footprints. That is, the wires are provided on both sides of the footprints.

Although even the configurations illustrated in FIGS. 8, 9, and 10 can suppress the mounting-position misalignment, a temperature unevenness, which is caused due to mounted components and the shape of farther portions of the led-out wires, makes it difficult to completely eliminate the mounting-position misalignment. As a result, the mounting-position misalignment easily occurs in directions parallel to the directions in which the IC pins are led out. Leading the wires out to the both sides by dummy patterns, as illustrated in FIG. 11, suppresses the mounting-position misalignment in the directions parallel to the directions in which the IC pins are led out.

Note that, in FIGS. 8, 9, and 10, for convenience, the shape of the resist opening is shown as a rectangle. However, the shape of the resist opening is not limited to this. The resist opening is provided to expose the entire surface of the footprint and has a shape corresponding to the shape of the footprint. An example of the shape corresponding to the footprint is a similar figure of the footprint. If the resist opening is formed in the similar figure of the footprint, it is possible to form a small-sized opening capable of exposing the entire surface of the footprint.

Figure 12:
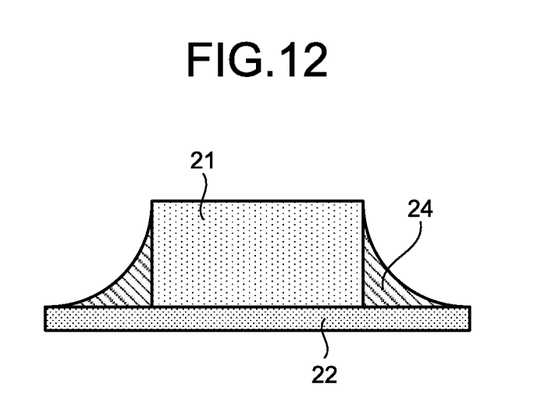
FIG. 12 is a sectional view along a circumferential direction, the view illustrating a connection between an IC pin and a footprint on the wiring board according to the first embodiment.
Figure 13:
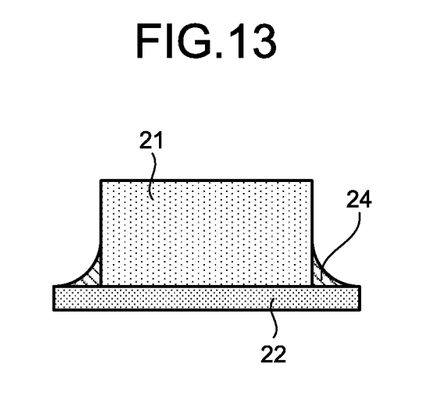
FIG. 13 is a sectional view along the circumferential direction, the view illustrating the connection between the IC pin and the footprint on the wiring board according to the first embodiment.

FIGS. 12 and 13 are sectional views illustrating a connection between an IC pin 21 and a footprint 22 in a direction perpendicular to a direction in which the IC pin is led out. As illustrated in FIG. 12, a solder fillet 24 is formed in a solder-fillet formation region on a clearance of the footprint 22. The wide solder fillet formation region on the footprint 22 as illustrated in FIG. 12 increases the solder strength. Meanwhile, the clearance of the footprint 22 needs to be reduced to improve the mounting position accuracy in the circumferential direction. If the clearance of the footprint 22 is reduced, the solder-fillet formation region narrows as shown in FIG. 13 and thus decreases the solder strength. The solder-fillet formation region in the radial direction should be enlarged to suppress the decrease in the solder strength.

Note that an angle formed between the solder fillet 24 and the footprint 22 having the fillet 24 formed on the surface thereof is preferably 15° or more and 45° or less.

Figure 14:
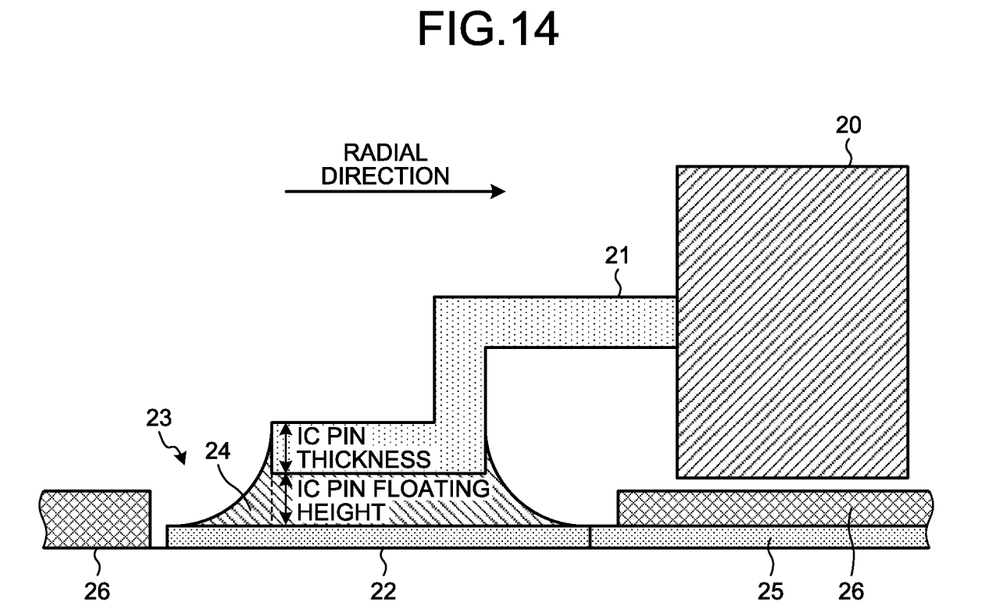
FIG. 14 is a sectional view along a radial direction, the view illustrating a connection between the IC pin and the footprint on the wiring board according to the first embodiment.

FIG. 14 is a sectional view of an opening of a resist 26, illustrating a connection between the IC pin 21 and the footprint 22 in a direction parallel to the radial direction that is a direction in which the IC pin is led out. The footprint 22 is connected to a wire 25. In FIG. 14, a clearance in the radial direction is preferably set to be equal to or larger than a sum of an IC pin thickness and an IC pin floating height that is a height from the surface of the footprint 22 to the bottom surface of the IC pin 21. Setting the clearance in the radial direction in this manner increases the solder strength, that is, the joining strength.

Figure 15:
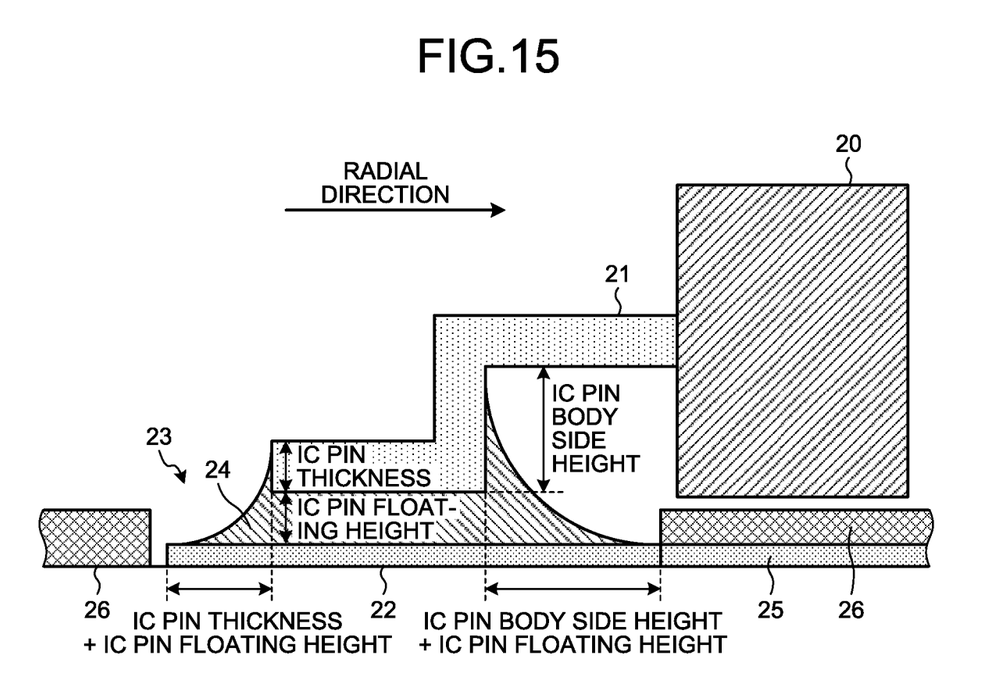
FIG. 15 is a sectional view along the radial direction, the view illustrating the connection between the IC pin and the footprint on the wiring board according to the first embodiment.

FIG. 15 is another sectional view of the opening of the resist 26, illustrating the connection between the IC pin 21 and the footprint 22 in the direction parallel to the radial direction that is the direction in which the IC pin is led out. The footprint 22 is connected to the wire 25. A clearance on an opposite side from the IC body 20 extends in the direction parallel to the radial direction that is the direction in which the IC pin is led out. This clearance is desirably set to be equal to or larger than the sum of the IC pin thickness and the IC pin floating height that is the height from the surface of the footprint 22 to the bottom surface of the IC pin 21, as in FIG. 14. A clearance on the IC body side extends in the direction parallel to the radial direction that is the direction in which the IC pin is led out. The clearance on the IC body side is desirably set to be equal to or larger than a sum of an IC-pin-body-side height and the IC pin floating height that is the height from the surface of the footprint 22 to the bottom surface of the IC pin 21. It is desirable to enlarge the clearance on the IC body side extending in the direction parallel to the radial direction that is the direction in which the IC pin is led out. This is because the enlarged clearance widens the solder-fillet formation region. Note that the IC-pin-body-side height is a height from the surface of the footprint 22 to the back surface of a non-bent portion of the IC pin 21 led out from the IC body 20.

Note that, in FIG. 15, the solder-fillet formation region is formed only on the footprint 22. However, the solder-fillet formation region can be formed by both of the footprint and the wire. That is, when the wires are led out in the directions toward the IC body side as illustrated in FIG. 10, the exposed portion of the wire in the resist opening can also be used as the fillet formation region. This enlarges the fillet formation region to thereby increase the solder strength.

Although this embodiment has been described illustrating as an example the wiring board on which the Hall ICs are mounted, the present invention is not limited to this. Other electronic components can be mounted on the wiring board. That is, according to an aspect of the present invention described in this embodiment, there is provided a wiring board on which an electronic component including a plurality of pins is mounted, the wiring board including: a base substrate; a plurality of wires provided on the base substrate; a resist covering the wires, and a plurality of footprints connected to the wires and having entire surfaces exposed in openings of the resist, the pins being soldered to the footprints by reflow. In the openings of the resist, directions in which the pins are led out are parallel to directions in which the wires are led out.

As explained above, according to this embodiment, it is possible to highly accurately suppress the mounting-position misalignment in the circumferential direction during heating in the reflow furnace without decreasing the solder strength. Since the mounting-position misalignment can be highly accurately suppressed, it is possible to suppress a decrease in yield.

Note that, as this embodiment has been described focusing on the connection between one pin and one footprint, the positional misalignment in a rotating direction of the IC chip has not been described. It is to be understood that since a plurality of pins are provided in the IC body 20 of the IC chip, it is possible to suppress the positional misalignment in the rotating direction as well.

Although this embodiment has been described illustrating the Hall IC as the IC chip, the present invention is not limited to this. It is only required that the IC chip is an IC needed to be positioned with a high accuracy without experiencing the mounting-position misalignment in the circumferential direction during the heating in the reflow furnace. Although the IC chip including the IC pins connected to the wiring board has been described in this embodiment, the present invention is not limited to this. It may be an electronic component including terminals that are pins connected to the wiring board.

Second Embodiment

Figure 16:
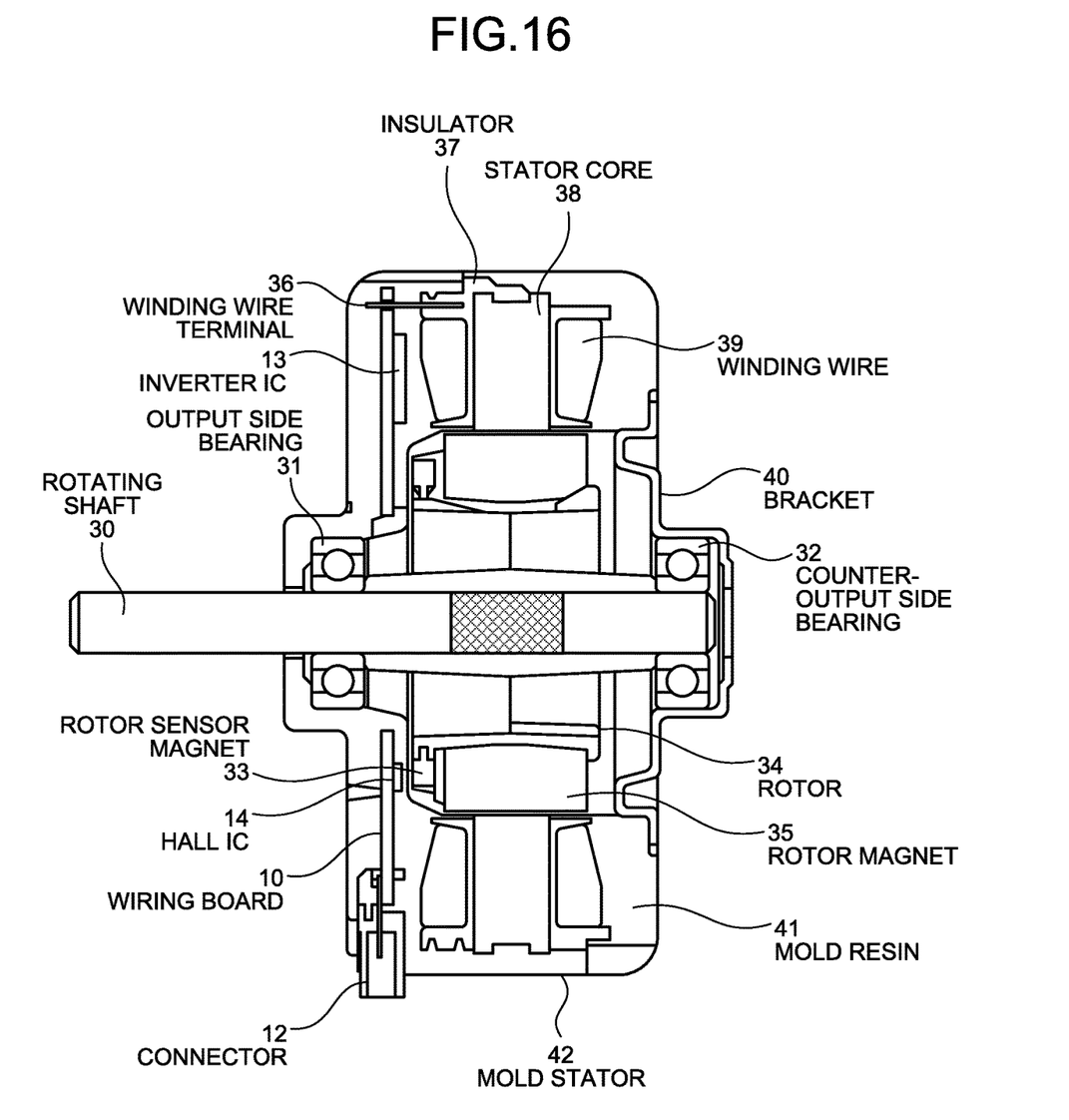
FIG. 16 is a diagram illustrating an electric motor according to a second embodiment.

The wiring board described in the first embodiment is applicable as, for example, a wiring board incorporated in an electric motor. FIG. 16 is a sectional view illustrating the configuration of an electric motor according to this embodiment. The electric motor illustrated in FIG. 16 is a brushless DC motor including the wiring board 10, a rotating shaft 30, an output side bearing 31, a counter-output side bearing 32, a rotor sensor magnet 33, a rotor 34, a rotor magnet 35, a winding terminal 36, an insulator 37, a stator core 38, a winding 39, a bracket 40, a mold resin 41, and a mold stator 42.

The wiring board 10 includes the connector 12, the inverter IC 13, and a Hall IC 14. The Hall IC 14 detects the position of the rotor 34. The wiring board 10 is disposed perpendicularly to the axial direction of the rotating shaft 30 between the output side bearing 31 and a stator. The wiring board 10 is secured to the insulator 37. The insulator 37 electrically insulates the stator core 38 and the winding wire 39 from each other. The stator core 38 is formed by a stack of electromagnetic steel plates. The winding 39 is wound on slots of the stator core 38 via the insulator 37 and connected to the inverter IC 13 of the wiring board 10 via the winding terminal 36. The connector 12 including a lead wire connected to a control circuit is disposed on the wiring board 10. The mold stator 42 is configured by the stator and the wiring board 10 formed integrally with the mold resin 41. A recess is provided inside the mold stator 42 to accommodate the rotor 34. When the stator and the wiring board 10 are formed integrally with the mold resin 41, the solder needs to have the strength with respect to a large thermal stress applied to the solder due to the difference in coefficient of thermal expansion between the mold resin 41 and the solder. The rotor 34 includes the rotor magnet 35 disposed inside the mold stator 42 and on the outer circumference side of the rotating shaft 30 in a facing relation with the stator core 38. The rotor sensor magnet 33 to detect the position of the Hall IC 14 is disposed in the rotor 34 centering the rotating shaft 30 that is the center of a circle. Note that the illustrated rotor magnet 35 is a permanent magnet such as a ferrite magnet and a rare earth magnet. One end of the rotating shaft 30 carries the output side bearing 31 that rotatably supports the rotating shaft 30. The other end of the rotating shaft 30 carries the counter-output side bearing 32 that rotatably supports the rotating shaft 30. The bracket 40 is electrically conductive and fits in the inner circumferential portion of the mold stator 42 to close an opening section of the recess of the mold stator 42. An outer race of the counter-output side bearing 32 fits inside the bracket 40.

Figure 17:
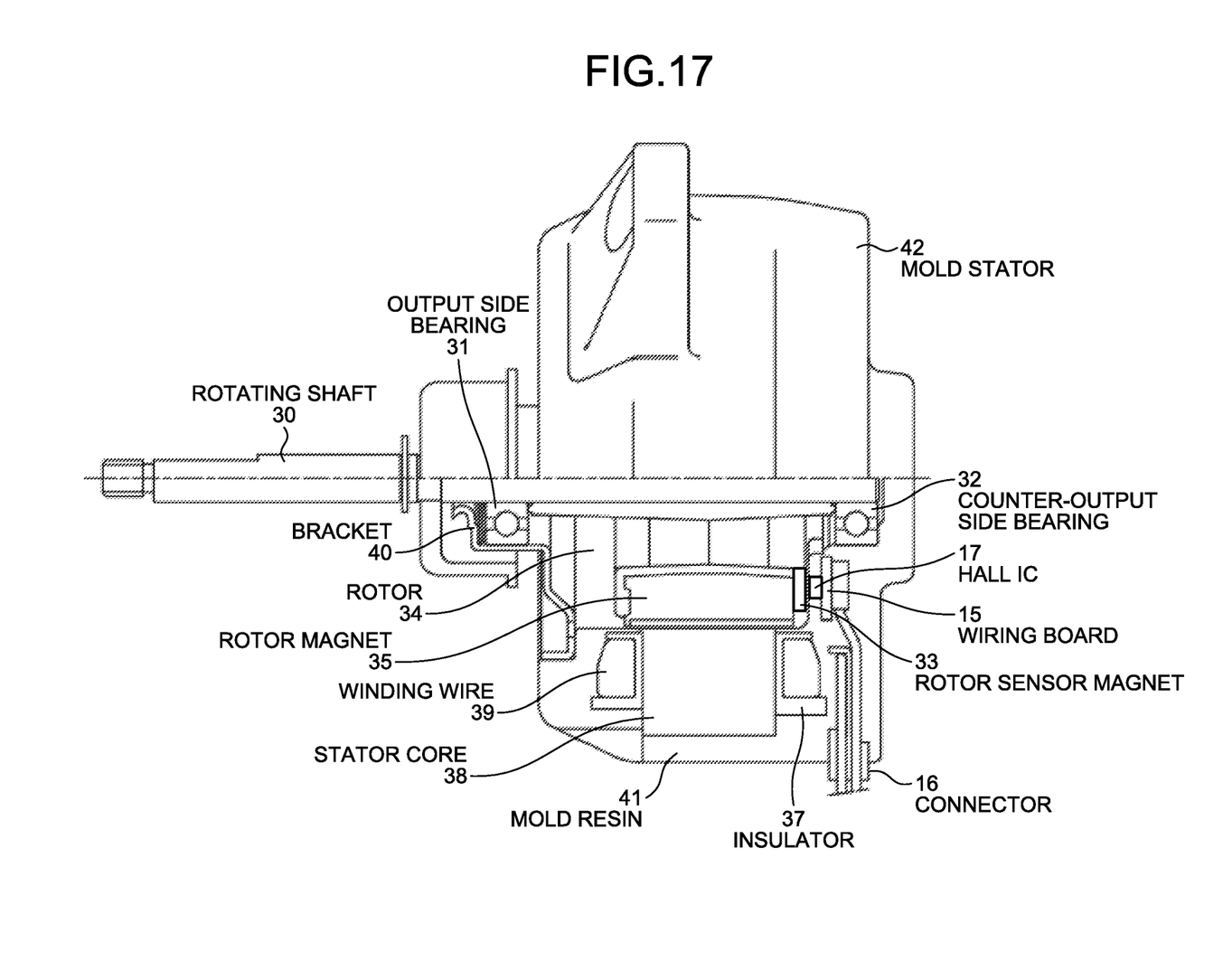
FIG. 17 is a diagram illustrating the electric motor according to the second embodiment.

FIG. 17 is a sectional view illustrating the configuration of the electric motor according to this embodiment but illustrates a different form from that in FIG. 16. The electric motor illustrated in FIG. 16 is a brushless DC motor including the wiring board 15, the rotating shaft 30, the output side bearing 31, the counter-output side bearing 32, the rotor sensor magnet 33, the rotor 34, the rotor magnet 35, the insulator 37, the stator core 38, the winding 39, the bracket 40, the mold resin 41, and the mold stator 42. That is, the electric motor includes the wiring board 15 instead of the wiring board 10 illustrated in FIG. 16. Note that a winding terminal is not illustrated in the figure. The wiring board 15 includes the connector 16 and a Hall IC 17. The Hall IC 17 detects the position of the rotor 34.

In the electric motors shown in FIGS. 16 and 17, the stator and the wiring board 10 are formed integrally to improve a thermal radiation and safety. Solder strength for connecting the wiring board 10 and the Hall IC 14 should be high. As described in the first embodiment, maintaining the high solder strength high prevents a failure of the electric motor due to the Hall IC coming off and thus prevents deterioration in reliability. Note that since the mounting-position misalignment in the circumferential direction of the Hall IC is highly accurately suppressed in the electric motor in this embodiment, variation in the mounting position in the circumferential direction among the Hall ICs is suppressed. Consequently, variation in an advance angle greatly affecting the efficiency of the motor is suppressed and the power consumption is reduced.

Third Embodiment

Figure 18:
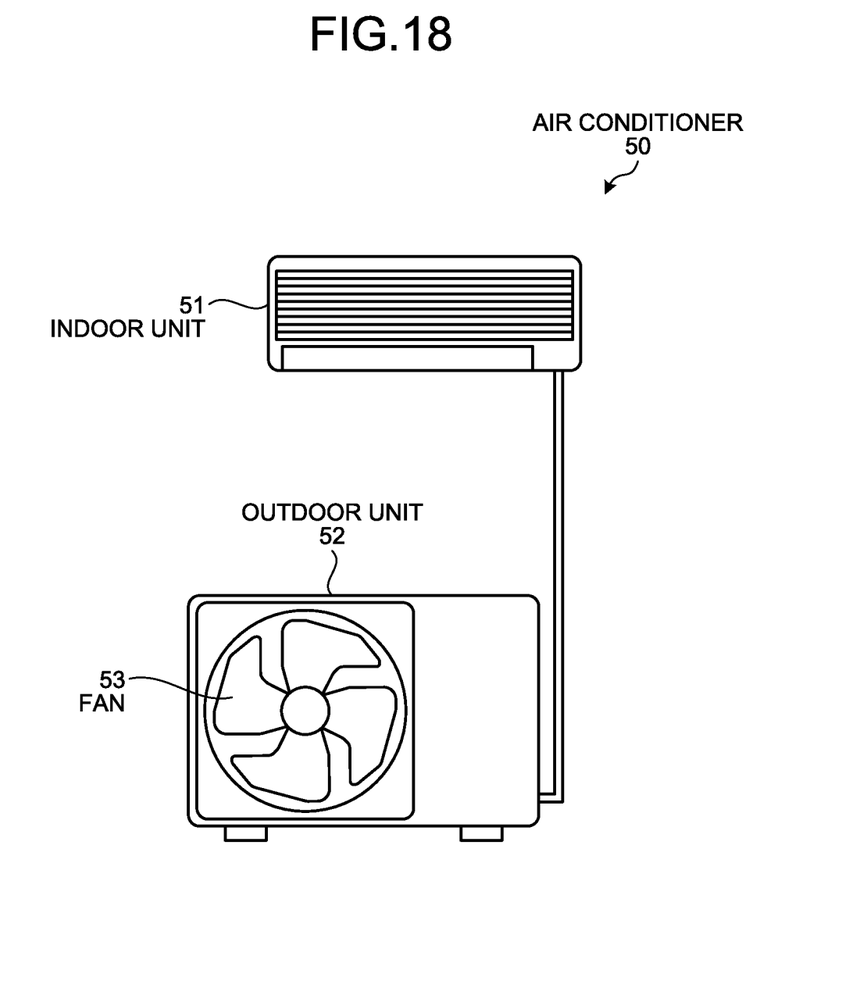
FIG. 18 is a diagram illustrating an air conditioner that is an example of an electric apparatus according to a third embodiment.

The electric motor explained in the second embodiment can be applied to various electric apparatuses. As such electric apparatuses, an air conditioner can be illustrated. FIG. 18 is an exterior view illustrating the configuration of an air conditioner that is an example of an electric apparatus according to the present invention. An air conditioner 50 illustrated in FIG. 18 includes an indoor unit 51, an outdoor unit 52, and a fan 53. The outdoor unit 52 is connected to the indoor unit 51. Note that, although not illustrated in the figure, the indoor unit 51 includes an indoor unit blower. The outdoor unit 52 includes an outdoor unit blower. The indoor unit blower and the outdoor unit blower include drive sources that are the electric motors described in the second embodiment.

Since the electric motors in the second embodiment are applied to the indoor unit blower and the outdoor unit blower in this embodiment, it is possible to prevent a failure of the electric motor and thus prevent deterioration in reliability. It is also possible to prevent a failure of the indoor unit blower and the outdoor unit blower and thus prevent deterioration in reliability.

Note that the electric motor described in the second embodiment is not limited to the indoor unit blower and the outdoor unit blower and can be mounted on an exhaust fan, a household electrical appliance, and a machine tool. Since the electric motor in the second embodiment is applied to the exhaust fan, the household electrical appliance, and the machine tool, it is possible to prevent a failure of the electric motor and prevent deterioration in reliability. It is possible to prevent failures of the exhaust fan, the household electrical appliance, and the machine tool and thus prevent deterioration in reliability.

REFERENCE SIGNS LIST 10, 15 wiring board
10a, 15a base substrate
11 hole
12, 16 connector
13 inverter IC
14, 14a to 14c, 14A to 14C, 17, 17a to 17c Hall IC
20 IC main body
21, 21a to 21c IC pin
22, 22a to 22c footprint
23, 23a to 23c resist opening section
24 solder fillet
25, 25a to 25i, 25A to 25C wire
26 resist
30 rotating shaft
31 output side bearing
32 counter-output side bearing
33 rotor sensor magnet
34 rotor
35 rotor magnet
36 winding terminal
37 insulator 38 stator core
39 winding
40 bracket
41 mold resin
42 mold stator
50 air conditioner
51 indoor unit
52 outdoor unit
53 fan

The invention claimed is:

1. A wiring board on which an electronic component to detect a magnetic-pole rotational position of a rotor is mounted, the electronic component including a pin with a pad, the wiring board comprising:
a base substrate having an origin on an axis of rotation of the rotor;
a wire provided on the base substrate;
a resist covering the wire, the resist including a footprint opening; and
a footprint connected to the wire and exposed by the footprint opening of the resist, the pad of the pin being soldered to the footprint, wherein
a direction in which the wire at a connection between the footprint and the wire is led out is parallel to a direction in which the pin is led out, and
the direction in which the pin is led out is a direction inclined at 45 degrees or less relative to a straight line interconnecting the origin and the electronic component on the base substrate.

2. The wiring board according to claim 1, wherein the direction in which the wire is led out is identical with the direction in which the pin is led out.

3. The wiring board according to claim 1, wherein the wire is led out to both sides of the footprint.

4. The wiring board according to claim 1, wherein the direction in which the pin is led out is parallel to a radial direction from the origin of the wiring board to the electronic component.

5. An electric motor comprising the wiring board according to claim 1, wherein the wiring board has an origin on an axis of rotation.

6. The electric motor according to claim 5, wherein a stator and the wiring board are formed integrally with resin.

7. An electric apparatus comprising the electric motor according to claim 5.

8. An air conditioner being the electric apparatus according to claim 7.

9. A wiring board on which an electronic component to detect a magnetic-pole rotational position of a rotor is mounted, the electronic component including a pin with a pad, the wiring board comprising:
a base substrate having an origin on an axis of rotation of the rotor;
a wire provided on the base substrate;
a resist covering the wire, the resist including a footprint opening; and
a footprint connected to the wire and exposed by the footprint opening of the resist, the pad of the pin being soldered to the footprint, wherein
a direction in which the wire at a connection between the footprint and the wire is led out is parallel to a direction in which the pin is led out,
the pin has a bent portion bent in a thickness direction of the electronic component, and
a distance from an end portion of the resist defining the footprint opening to a base point of the bent portion of the pin is larger than a height from a surface of the footprint to a base point from which the pin is led out from the electronic component.

10. The wiring board according to claim 9, wherein a fillet resulting from the soldering is formed on the wire exposed in the footprint opening of the resist.

11. The wiring board according to claim 9, wherein the direction in which the wire is led out is identical with the direction in which the pin is led out.

12. The wiring board according to claim 9, wherein the wire is led out to both sides of the footprint.

13. The wiring board according to claim 9, wherein the direction in which the pin is led out is parallel to a radial direction from the origin of the wiring board to the electronic component.

14. An electric motor comprising the wiring board according to claim 9, wherein the wiring board has an origin on an axis of rotation.

15. The electric motor according to claim 14, wherein a stator and the wiring board are formed integrally with resin.

16. An electric apparatus comprising the electric motor according to claim 14.

17. An air conditioner being the electric apparatus according to claim 16.

* * * * *